United States Patent
Glenn et al.

(10) Patent No.: US 6,342,406 B1
(45) Date of Patent: Jan. 29, 2002

(54) FLIP CHIP ON GLASS IMAGE SENSOR PACKAGE FABRICATION METHOD

(75) Inventors: Thomas P. Glenn, Gilbert; Steven Webster; Roy Dale Hollaway, both of Chandler, all of AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/714,682

(22) Filed: Nov. 15, 2000

(51) Int. Cl.[7] .................. H01L 21/00; H01L 21/44; H01L 21/48; H01L 20/50
(52) U.S. Cl. .................. 438/57; 438/60; 438/64; 438/116
(58) Field of Search .................. 438/57, 60, 64, 438/116

(56) References Cited

U.S. PATENT DOCUMENTS

| | | | |
|---|---|---|---|
| 4,801,998 A | 1/1989 | Okuaki | 357/72 |
| 5,222,014 A | 6/1993 | Lin | 361/414 |
| 5,231,036 A * | 7/1993 | Miyauchi et al. | |
| 5,578,525 A | 11/1996 | Mizukoshi | 437/206 |
| 5,579,207 A | 11/1996 | Hayden et al. | 361/790 |
| 5,786,589 A | 7/1998 | Segawa et al. | 250/208.1 |
| 5,821,532 A | 10/1998 | Beaman et al. | 250/239 |
| 5,867,368 A | 2/1999 | Glenn | 361/783 |
| 5,907,151 A | 5/1999 | Gramann et al. | 250/214.1 |
| 5,962,810 A | 10/1999 | Glenn | 174/52.2 |
| 5,973,337 A | 10/1999 | Knapp et al. | 257/99 |
| 6,046,070 A * | 4/2000 | Shoji et al. | |
| 6,122,009 A | 9/2000 | Ueda | 348/335 |
| 6,143,981 A | 11/2000 | Glenn | 174/52.4 |
| 6,144,507 A | 11/2000 | Hashimoto | 359/819 |
| 6,247,229 B1 | 6/2001 | Glenn | 29/841 |
| 6,281,568 B1 | 8/2001 | Glenn et al. | 257/684 |

OTHER PUBLICATIONS

Lapp et al., *New Substrate for Advanced Flat Panel Display Applications*, Product Information Sheet, 1994, 4 pages.
Corning Incorporated, *1737 Sheet Glass*, Product Information Sheet, revised Mar. 1997, 2 pages.
Corning Incorporated, *Industrial Grade Products*, Product Information Sheet, revised Mar. 1997, 2 pages.
Corning Incorporated, *Code: 1737F*, Material Information Sheet, issued Jan. 1996, 5 pages.
Corning Incorporated, *Display Grade Products*, Product Information Sheet, revised Jul. 1995, 4 pages.
Corning Incorporated, *Score Cutting of 7059F and 1737F Sheet Glasses*, Application Information Sheet, revised Apr. 1996, 2 pages.

* cited by examiner

*Primary Examiner*—John F. Niebling
*Assistant Examiner*—Josetta Jones
(74) *Attorney, Agent, or Firm*—Gunnison, McKay & Hodgson, L.L.P.; Serge J. Hodgson

(57) ABSTRACT

Electrically conductive interior traces and exterior traces are formed on interior and exterior surfaces, respectively, of a window. The interior traces are electrically connected to the exterior traces by electrically conductive vias extending through the window. To mount the window to an image sensor, the interior traces are aligned with bond pads on a front surface of the image sensor. Flip chip bumps are formed between the interior traces and the bond pads thus mounting the window to the image sensor. A sealer is applied to form a seal between the window and the image sensor and to protect an active area of the image sensor.

18 Claims, 5 Drawing Sheets

FLIP CHIP ON GLASS IMAGE SENSOR PACKAGE FABRICATION METHOD

BACKGROUND OF THE INVENTION

1. Field of the Invention

The present invention relates generally to the packaging of electronic components. More particularly, the present invention relates to a method of fabricating an image sensor package.

2. Description of the Related Art

Image sensors are well known to those of skill in the art. An image sensor included an active area, which was responsive to electromagnetic radiation. The image sensor was used to fabricate an image sensor assembly.

In one prior art image sensor assembly, the image sensor was located within a housing, which supported a window. Radiation passed through the window and struck the active area of the image sensor, which responded to the radiation.

To form the image sensor assembly, the image sensor was mounted to a printed circuit mother board. After the image sensor was mounted, a housing was mounted around the image sensor and to the print circuit mother board. This housing provided a seal around the image sensor, while at the same time, supported a window above the image sensor.

As the art moves to smaller and lighter weight electronic devices, it becomes increasingly important that the size of the image sensor assembly used within these electronic devices is small. Disadvantageously, the conventional image sensor assembly described above required a housing to support the window and to seal the image sensor. However, this housing was relatively bulky and extended upwards from the printed circuit mother board a significant distance, e.g., 0.100 inches (2.54 mm) to 0.120 inches (3.05 mm) or more. As a result, the image sensor assembly was relatively large.

In the event that moisture was trapped inside of the housing, defective operation or failure of the image sensor assembly was observed. More particularly, the moisture had a tendency to condense within the housing and on the interior surface of the window. Even if the housing later dried out, a stain was left on the window. In either event, electromagnetic radiation passing through the window was distorted or obstructed by either moisture condensation or stain, which resulted in defective operation or failure of the image sensor assembly.

For this reason, an important characteristic was the temperature at which condensation formed within the housing of the image sensor assembly, i.e., the dew point of the image sensor assembly. In particular, it was important to have a low dew point to insure satisfactory performance of the image sensor assembly over a broad range of temperatures.

SUMMARY OF THE INVENTION

In accordance with the present invention, an image sensor package includes an image sensor having an active area and bond pads on a front surface of the image sensor. A window of the image sensor package has an interior surface and an exterior surface opposite the interior surface. Electrically conductive interior traces are formed on the interior surface of the window. The window is mounted to the image sensor by flip chip bumps formed between the bond pads of the image sensor and the interior traces on the interior surface of window.

The window includes a central region aligned with the active area of the image sensor. A peripheral region of the window includes the interior traces, electrically conductive exterior traces formed on the exterior surface of the window, and electrically conductive vias electrically connecting the exterior traces to the interior traces. Electrically conductive pads are formed on the exterior traces. Electrically conductive interconnection balls are formed on the pads.

Advantageously, the interior traces, the vias, and the exterior traces are formed within the peripheral region of the window and the central region of the window remains unobstructed. Accordingly, radiation passing through the central region of the window, which strikes the active area of image sensor, is not obstructed or distorted.

The window has an area less than an area of the front surface of the image sensor. Advantageously, this allows the image sensor package to be the size of the image sensor, i.e., the image sensor package is chip size. Further, by avoiding the use of the housing of a prior art image sensor assembly, the image sensor package in accordance with the present invention can also be made relatively thin. Accordingly, the image sensor package is extremely well suited for use with miniature lightweight electronic devices, which require small, thin and lightweight image sensor assemblies.

The window, a bead between the window and the image sensor, and the image sensor define a sealed cavity in which the active area is located. Advantageously, the volume of the cavity is relatively small. By minimizing the volume of the cavity, the amount of any moisture trapped within the cavity is also minimized. This, in turn, essentially eliminates the possibility of moisture condensation on the interior surface of the window or on the active area of the image sensor. As a result, the image sensor package has a very low or nonexistent dew point.

In an alternative embodiment, the cavity is completely filled with a transparent encapsulant. Advantageously, by eliminating the prior art cavity between the active area and the window, the possibility of moisture condensation within the cavity is also eliminated. Accordingly, the image sensor package in accordance with this embodiment has no dew point.

Further, by using a transparent encapsulant having a refractive index similar to the refractive index of the window, the amount of reflected radiation is minimized. This improves the sensitivity of the image sensor package compared to prior art image sensor assemblies.

Also in accordance to the present invention, a method of forming an image sensor package includes forming an electrically conductive exterior trace on an exterior surface of a window. An electrically conductive interior trace is formed on an interior surface of the window, the interior trace being electrically connected to the exterior trace. The interior trace is aligned with a bond pad on a first surface of an image sensor. An electrically conductive bump is formed between the interior trace and the bond pad thus mounting the window to the image sensor.

These and other features and advantages of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

Figure 1:
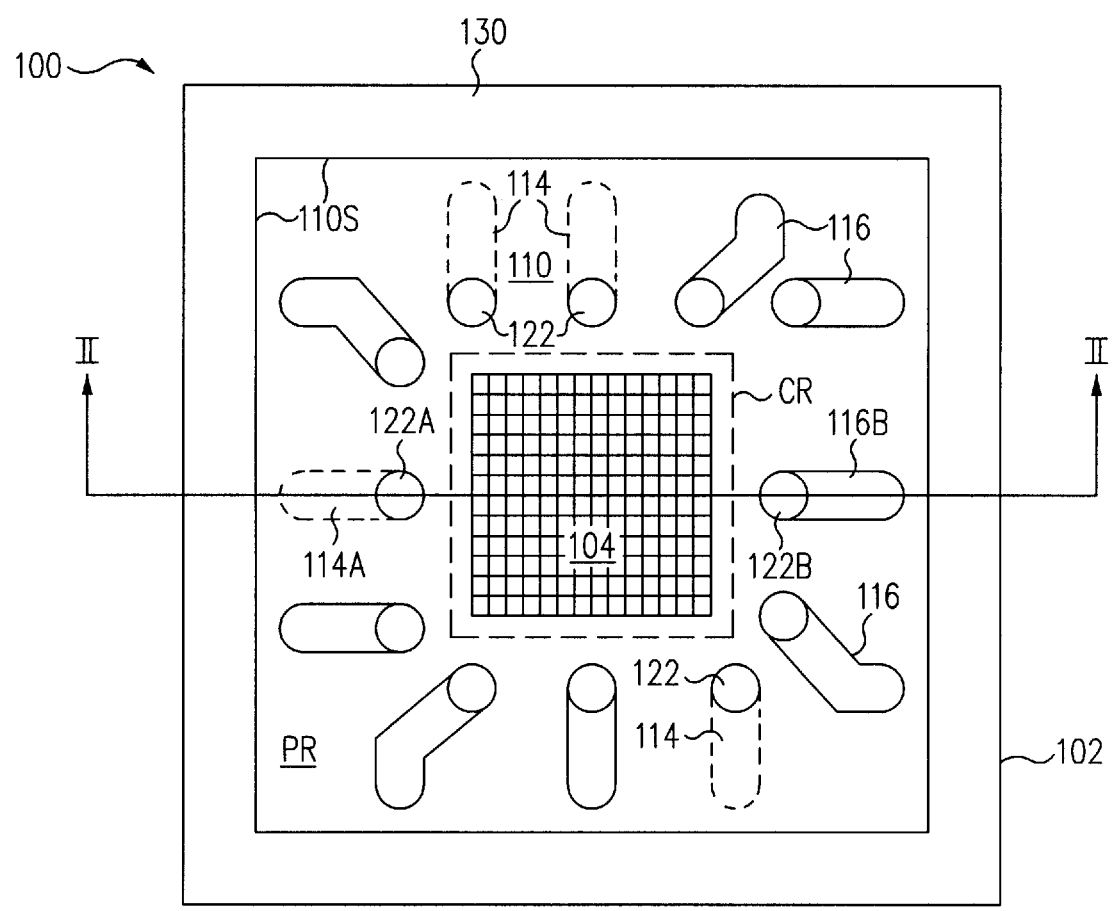
FIG. 1 is a top plan view of an image sensor package in accordance with the present invention.

An image sensor package 100 (FIGS. 1, 2) includes an image sensor 102, sometimes called an optical sensor, having an active area 104 and bond pads 106 on a front surface 102F of image sensor 102. A window 110 of image sensor package 100 has an interior surface 110I and an exterior surface 110E opposite interior surface 110I. Electrically conductive interior traces 114 are formed on interior surface 110I of window 110. Window 110 is mounted to image sensor 102 by flip chip bumps 112 formed between bond pads 106 of image sensor 102 and interior traces 114 on interior surface 110I of window 110.

Window 110 includes a central region CR aligned with active area 104 of image sensor 102. A peripheral region PR of window 110 includes interior traces 114, exterior traces 116 formed on exterior surface 110E of window 110, and vias 118 electrically connecting exterior traces 116 to interior traces 114. Pads 120 are formed on exterior traces 116. Interconnection balls 122 are formed on pads 122.

Advantageously, interior traces 114, vias 118, exterior traces 116 are formed within peripheral region PR of window 110 and central region CR of window 110 remains unobstructed. Accordingly, radiation passing through central region CR of window 110, which strikes active area 104 of image sensor 102, is not obstructed or distorted.

Window 110 has an area less than an area of front surface 102F of image sensor 102. Advantageously, this allows image sensor package 100 to be the size of image sensor 102, i.e., image sensor package 100 is chip size.

Figure 2:
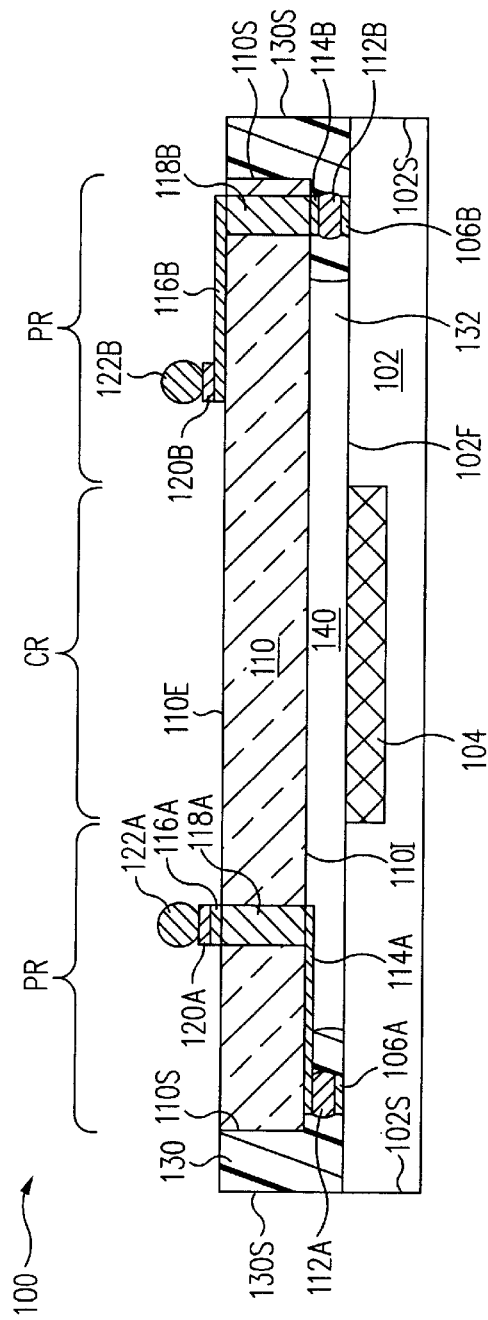
FIG. 2 is a cross-sectional view of the image sensor package along the line II—II of FIG. 1.

More particularly, FIG. 1 is a top plan view of an image sensor package 100 (hereinafter package 100) in accordance with the present invention. FIG. 2 is a cross-sectional view of package 100 along the line II—II of FIG. 1.

Referring to FIGS. 1 and 2 together, package 100 includes an image sensor 102. Image sensor 102 includes an active area 104 on a front, e.g., first, surface 102F of image sensor 102. Image sensor 102 further includes a plurality of bond pads 106 on front surface 102F of image sensor 102.

Generally, active area 104 is responsive to radiation, e.g., electromagnetic radiation, as is well known to those of skill in the art. For example, active area 104 is responsive to infrared radiation, ultraviolet light, and/or visible light. Illustratively, image sensor 102 is a CMOS image sensor device, a charge coupled device (CCD), a pyroelectric ceramic on CMOS device, or an erasable programmable read-only memory device (EPROM) although other image sensors are used in other embodiments.

Package 100 further includes a window 110 above active area 104. Generally, window 110 is transparent to the radiation of interest, e.g., to the radiation to which active area 104 of image sensor 102 is responsive, as those of skill in the art will understand. Generally, the transmittance of window 110 is sufficient to allow the necessary minimum amount of radiation needed for the proper operation of image sensor 102 to pass through window 110.

Illustratively, window 110 is borosilicate glass, but can be formed of other material depending upon the application. In one particular example, window 110 is fusion formed 1737 glass composition, designated as 1737F, supplied by Corning Inc. of Corning, N.Y. For a detailed description see: (1) "material information" sheet for "code: 1737F" issued 1/96, 5 pages total; (2) "product information" sheet for "display grade products", revised 7/95, 4 pages total; and (3) "product information" sheet for "industrial grade products", revised 3/97, 2 pages total, which are all by Corning Inc., Advanced Display Products, Corning, N.Y., 14831, which are all herein incorporated by reference in their entireties. Illustratively, window 110 has a thickness of 0.7 mm (0.027 in.) but has other thicknesses in other embodiments.

During use, radiation is directed at package 100. This radiation passes through window 110, through medium 140 and strikes active area 104, which responds to the radiation as is well known to those of skill in the art. However, in an alternative embodiment, active area 104 of image sensor 102 transmits radiation such as electromagnetic radiation. For example, image sensor 102 is a light emitting diode (LED) microdisplay. In accordance with this embodiment, radiation transmitted by active area 104 passes through medium 140, through window 110, and emanates from package 100. For simplicity, in the above and following discussions, active area 104 as a receiver of radiation is set forth. However, in light of this disclosure, those of skill in the art will recognize that generally active area 104 can be a receiver of radiation, a transmitter of radiation, or a transceiver, i.e., a transmitter and a receiver, of radiation.

Window 110 includes an interior, e.g., first, surface 110I, which faces towards front surface 102F of image sensor 102. Window 110 further includes an exterior, e.g., second, surface 110E, opposite interior surface 110I. Exterior surface 110E is exposed to the ambient environment. Sides 110S of window 110 extend between interior surface 110I and exterior surface 110E.

Formed on interior surface 110I are a plurality of electrically conductive interior traces 114, which include a first interior trace 114A. Interior traces 114 are illustrated in dashed lines in FIG. 1 for purposes of clarity. Bond pads 106 are electrically connected to corresponding interior traces 114 by corresponding electrically conductive bumps 112, sometimes called flip chip bumps 112. Illustratively, bumps 112 are: (1) stud bumps, i.e., gold balls; (2) electrically conductive epoxy paste; (3) electrically conductive epoxy film; or (4) solder.

Formed on exterior surface 110E are a plurality of electrically conductive exterior traces 116, which include a first exterior trace 116A. Exterior traces 116 are electrically connected to corresponding interior traces 114 by corresponding electrically conductive vias 118. Vias 118 extend through window 110 from interior surface 110I to exterior surface 110E.

Formed on exterior traces 116 are a plurality of electrically conductive pads 120, which include a first pad 120A. Formed on pads 120 are a plurality of electrically conductive interconnection balls 122, e.g., solder, which include a first interconnection ball 122A. Interconnection balls 122 are used to connect package 100 to a printed circuit mother board having an aperture aligned with active area 104.

To illustrate, a first bond pad 106A of the plurality of bond pads 106 is electrically and physically connected to interior trace 114A by a first bump 112A of the plurality of bumps 112. Interior trace 114A is electrically connected to exterior trace 116A by a first via 118A of the plurality of vias 118. Formed on via 118A is pad 120A. Formed on pad 120A is interconnection ball 122A.

As set forth, an electrically conductive pathway between bond pad 106A and interconnection ball 122A is formed by bump 112A, interior trace 114A, via 118A, exterior trace 116A, and pad 120A. The other bond pads 106, interior traces 114, vias 118, exterior traces 116, pads 120, and interconnection balls 122 are electrically connected to one another in a similar fashion so are not discussed further to avoid detracting from the principals of the invention.

Although a particular electrically conductive pathway between bond pad 106A and interconnection ball 122A is described above, in light of this disclosure, it is understood that other electrically conductive pathways can be formed. For example, contact metallizations can be formed between the various electrical conductors, e.g., between bond pads 106 and bumps 112, between bumps 112 and interior traces 114, between exterior traces 116 and pads 120, and/or between pads 120 and interconnection balls 122. Alternatively, pads 120 are not formed and interconnection balls 122 are formed directly on exterior traces 116.

In one embodiment, interior traces 114 are lands aligned horizontally in the view of FIG. 2 with vias 118, bumps 112 and bond pads 106. To illustrate, a second interior trace 114B of the plurality of interior traces 114 is a land. Interior trace 114B is aligned with a second via 118B of the plurality of vias 118, with a second bump 112B of the plurality of bumps 112 and with a second bond pad 106B of the plurality of bond pads 106.

Alternatively, interior traces 114 are metallizations which extend along interior surface 110I of window 110 such that vias 118 are not aligned with bumps 112 and bond pads 106. To illustrate, interior trace 114A extends horizontally in the view of FIG. 2 from bump 112A (and bond pad 106A) to via 118A. Stated another way, via 118A is offset from bump 112A and interior trace 114A extends along interior surface 110I to electrically connect via 118A to bump 112A.

Similarly, exterior traces 116 are lands aligned horizontally in the view of FIG. 2 with vias 118, pads 120 and interconnection balls 122. To illustrate, exterior trace 116A is a land. Exterior trace 116A is aligned with via 118A, with pad 120A and with interconnection ball 122A.

Alternatively, exterior traces 116 are metallizations which extend along exterior surface 110E of window 110 such that vias 118 are not aligned with pads 120 and interconnection balls 122. To illustrate, a second exterior trace 116B of the plurality of exterior traces 116 extends horizontally in the view of FIG. 2 from second via 118B to a second pad 120B of the plurality of pads 120. Stated another way, via 118B is offset from pad 120B and exterior trace 116B extends along exterior surface 110E to electrically connect via 118B to pad 120B. A second interconnection ball 122B of the plurality of interconnection balls 122 is formed on pad 120B.

As yet another alternative, interconnection balls 122 are distributed in an array format to form a ball grid array (BGA) type package. Alternatively, interconnection balls 122 are not formed, e.g., to form a metal land grid array (LGA) type package. Other electrically conductive pathway modifications will be obvious to those of skill in the art.

Of importance, window 110 includes a central region CR and a peripheral PR. Central region CR is aligned with and is above active area 104. During use, radiation striking active area 104 has passed through central region CR. Accordingly, it is important that central region CR is free from defects and contamination, which could obstruct or distort radiation.

In this embodiment, peripheral region PR surrounds central region CR and is formed around a periphery of window 110 adjacent sides 110S. Advantageously, interior traces 114, vias 118, and exterior traces 116 are formed within peripheral region PR of window 110. Accordingly, bumps 112, interior traces 114, vias 118, exterior traces 116, pads 120, and interconnection balls 122 do not obstruct or distort radiation striking active area 104.

A bead 130 contacts the periphery of front surface 102F of image sensor 102 adjacent sides 102S of image sensor 102. Bead 130 also contacts peripheral region PR of window 110 thus securing window 110 to image sensor 102. In this embodiment, bead 130 contacts sides 110S of window 110 and extends slightly under window 110 between interior surface 110I of window 110 and front surface 102F of image sensor 102. In one embodiment, bead 130 encloses bond pads 106 and bumps 112. In another embodiment, bead 130 extends slightly over and contacts exterior surface 110E of window 110 directly adjacent sides 110S.

Bead 130 enhances the reliability of package 100 by preventing the failure of bumps 112 and preventing the associated dismounting of window 110. For example, bead 130 insures that window 110 does not become dismounted from image sensor 102 as a result of any differential thermal extension between window 110 and image sensor 102.

Further, bead 130 forms a seal between peripheral region PR of window 110 and image sensor 102. Thus, window 110, bead 130, and image sensor 102 define a cavity 132, which is sealed. In particular, active area 104 is located within cavity 132, which is sealed to protect active area 104 against external moisture, dust and contamination.

Generally, cavity 132 contains a medium 140, which is transparent to the radiation of interest. In one embodiment, medium 140 is air.

Advantageously, the volume of cavity 132 is relatively small. By minimizing the volume of cavity 132, the amount of any moisture trapped within cavity 132 is also minimized. This, in turn, essentially eliminates the possibility of moisture condensation on interior surface 110I of window 110 or active area 104 of image sensor 102. As a result, package 100 has a very low or nonexistent dew point.

Of importance, the area of window 110 in a plane parallel to front surface 102F of image sensor 102 is less than the area of front surface 102F in this same plane. This allows package 100 to be the size of image sensor 102, i.e., package 100 is chip size. Bead 130 has outer sides 130S coplanar with sides 102S of image sensor 102.

Further, package 100 is relatively thin compared to prior art image sensor assemblies. Package 100 is relatively thin since window 110 is mounted directly to image sensor 102 thus avoiding the use of a housing of the prior art. Illustratively, the thickness of package 100 is within the range of 1.0 mm to 1.5 mm (0.039 in. to 0.059 in.), e.g., is 1.2 mm (0.047 in.), although package 100 can have other thicknesses depending primarily upon the thickness of image sensor 102 and window 110. Accordingly, package 100 is extremely well suited for use with miniature light-weight electronic devices, which require small, thin and lightweight image sensor assemblies.

Figure 3:
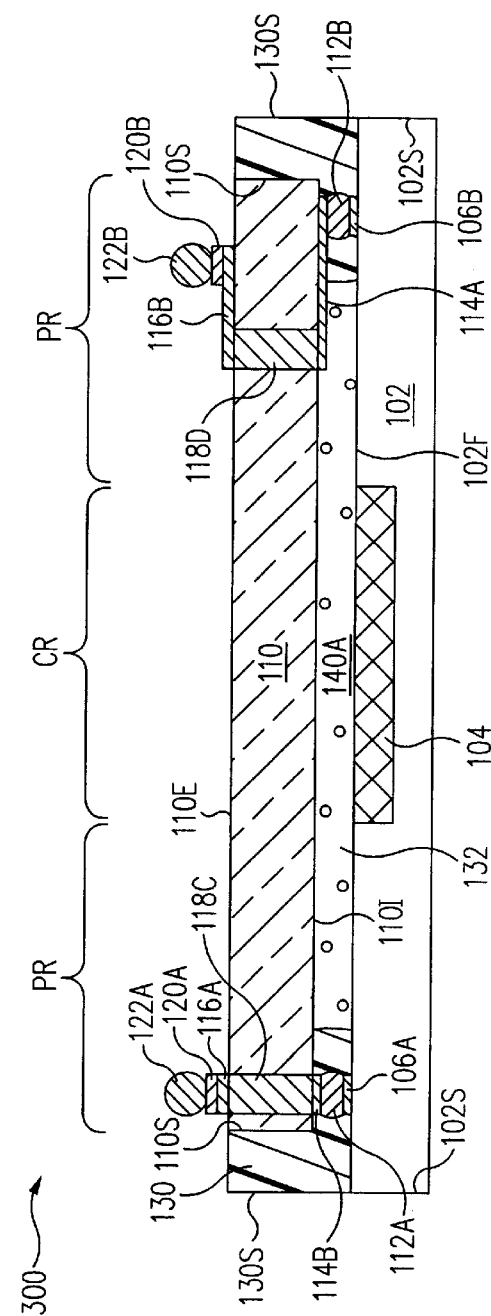
FIG. 3 is a cross-sectional view of an image sensor package in accordance with an alternative embodiment of the present invention.

FIG. 3 is a cross-sectional view of an image sensor package 300 (hereinafter package 300) in accordance with an alternative embodiment of the present invention. Package 300 of FIG. 3 is similar to package 100 of FIG. 2 and only the significant differences are discussed below.

Referring now to FIG. 3, in this embodiment, medium 140A is a transparent encapsulant, not air. In one embodiment, the refractive index of medium 140A is similar to the refractive index of window 110. In this manner, the sensitivity of package 300 is improved compared to the prior art.

Recall that in the prior art, a housing was mounted around the image sensor and to the print circuit mother board. This housing supported a window above the image sensor. However, located between the window and the image sensor was air. Disadvantageously, air has a relatively low refractive index compared to the window. As those skilled in the art understand, as visible light or other electromagnetic radiation passes from a material having a high refractive index to a material having a low refractive index and vice versa, a significant percentage of the electromagnetic radiation is reflected.

To illustrate, for a window having a refractive index of 1.52, at each window/air interface, approximately 4 percent of the electromagnetic radiation is reflected. Since the electromagnetic radiation had to pass from air, through the window, and back through air to reach the active area of the image sensor in the prior art, a significant percentage of the electromagnetic radiation was reflected. This resulted in an overall loss of sensitivity of prior art image sensor assemblies.

In contrast, window 110 and medium 140A of package 300 have a similar refractive index. Illustratively, the difference between the refractive index of window 110 and the refractive index of medium 140A is such that the amount of radiation reflected at the interface of window 110 and medium 140A is one percent or less. As an example, window 110 has a refractive index of 1.52 and medium 140A has a refractive index of 1.40. Accordingly, the amount of reflected radiation is reduced compared to the prior art. This improves the sensitivity of package 300 compared to prior art image sensor assemblies. In one embodiment, package 300 is 13% more sensitive to electromagnetic radiation than prior art image sensor assemblies.

Further, instead of having air between the window and the active area of the image sensor as in the prior art, medium 140A completely fills the region between window 110 and active area 104 and, more generally, fills cavity 132. In other words, package 300 is a cavityless package, i.e., package 300 does not have a cavity between window 110 and active area 104. Advantageously, by eliminating the prior art cavity between the active area and the window, the possibility of moisture condensation within the cavity is also eliminated. Accordingly, package 300 has no dew point.

In contrast, prior art image sensor assemblies had a dew point, i.e., a temperature at which condensation formed within the housing, which enclosed the image sensor and supported the window. In general, moisture had a tendency to condense within the housing and on the interior surface of the window. To avoid this condensation, it was important to avoid subjecting the image sensor assembly to extreme low temperatures. Disadvantageously, this limited the temperature range over which the image sensor assembly would satisfactorily perform.

Since package 300 does not have a dew point, package 300 operates satisfactorily over a broader range of temperatures and, more particularly, at lower temperatures than image sensor assemblies of the prior art. Further, since package 300 is a cavityless package, there is no possibility that moisture will leak into package 300. Accordingly, the reliability of package 300 is greater than that of the prior art.

As shown in FIG. 3, interior trace 114B and exterior trace 116A are lands aligned with a via 118C of the plurality of vias 118. More particularly, interior trace 114B and exterior trace 116A are aligned horizontally in the view of FIG. 3 with via 118C, bump 112A, bond pad 106A, pad 120A and interconnection ball 122A.

In contrast, interior trace 114A and exterior trace 116B are metallizations which extend along interior surface 110I and exterior surface 110E of window 110, respectively, such that a via 118D of the plurality of vias 118 is not aligned with either bump 112B or pad 120B.

Figure 4:
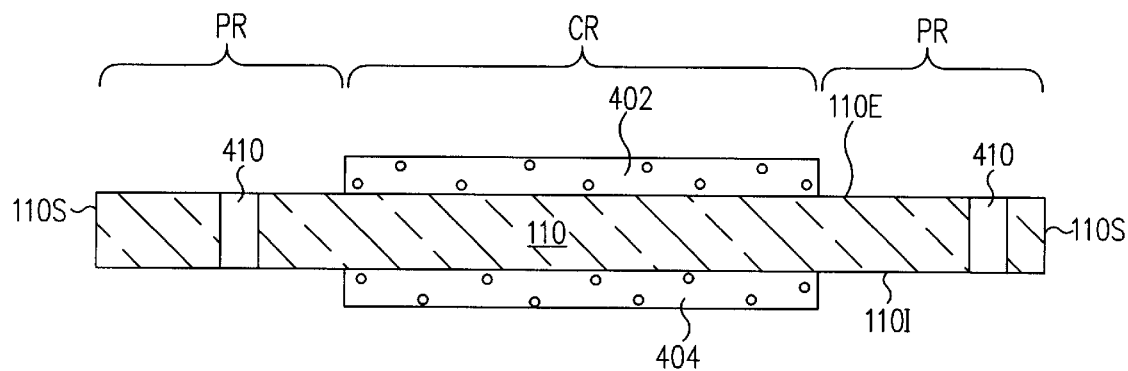
FIG. 4 is a cross-sectional view of a window during fabrication in accordance with one embodiment present invention.

FIG. 4 is a cross-sectional view of window 110 during fabrication in accordance with one embodiment of the present invention. As shown in FIG. 4, a mask 402, e.g., photoresist, is formed on central region CR of exterior surface 110E to cover and protect central region CR of exterior surface 110E from subsequent processing described below. Similarly, a mask 404, e.g., photoresist, is formed on central region CR of interior surface 110I to cover and protect central region CR of interior surface 110I from subsequent processing described below.

After masks 402, 404 are formed, apertures 410 are formed in peripheral region PR of window 110. Illustratively, apertures 410 are formed, e.g., by mechanical or laser drilling, through window 110. Apertures 410 extend from interior surface 110I to exterior surface 110E.

Figure 5:
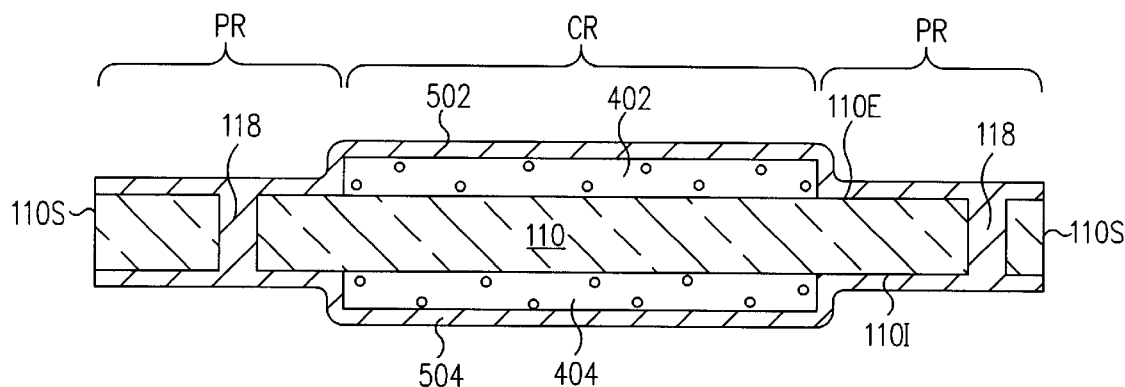
FIGS. 5, 6 and 7 are cross-sectional views of the window of FIG. 4 at later stages of fabrication.

FIG. 5 is a cross-sectional view of window 110 of FIG. 4 at a later stage of fabrication. Referring now to FIG. 5, an electrically conductive layer 502, hereinafter referred to as metal layer 502, is formed above exterior surface 11oE. More particularly, metal layer 502 is formed directly on peripheral region PR of exterior surface 110E of window 110 and is also formed directly on mask 402. Advantageously, mask 402 prevents metal layer 502 from directly contacting central region CR of exterior surface 110E of window 110.

Similarly, an electrically conductive layer 504, hereinafter referred to as metal layer 504, is formed above interior surface 110I. More particularly, metal layer 504 is formed directly on peripheral region PR of interior surface 110I of window 110 and is also formed directly on mask 404. Advantageously, mask 404 prevents metal layer 504 from directly contacting central region CR of interior surface 110I of window 110.

Illustratively, metal layers 502, 504 are formed by evaporation or plating of an electrically conductive material such indium, nickel, e.g., electroless nickel, or gold, e.g., electroless gold. Although not illustrated in FIG. 5, in one embodiment, metal layer 502 and/or metal layer 504 are also formed on sides 110S of window 110. In another embodiment, metal layer 502 and metal layer 504 are formed simultaneously, i.e., metal layer 502 and metal layer 504 are a single metal layer, which encloses window 110 and masks 402, 404.

Metal layer 502 and/or metal layer 504 fill apertures 410 (FIG. 4) forming electrically conductive vias 118.

Figure 6:
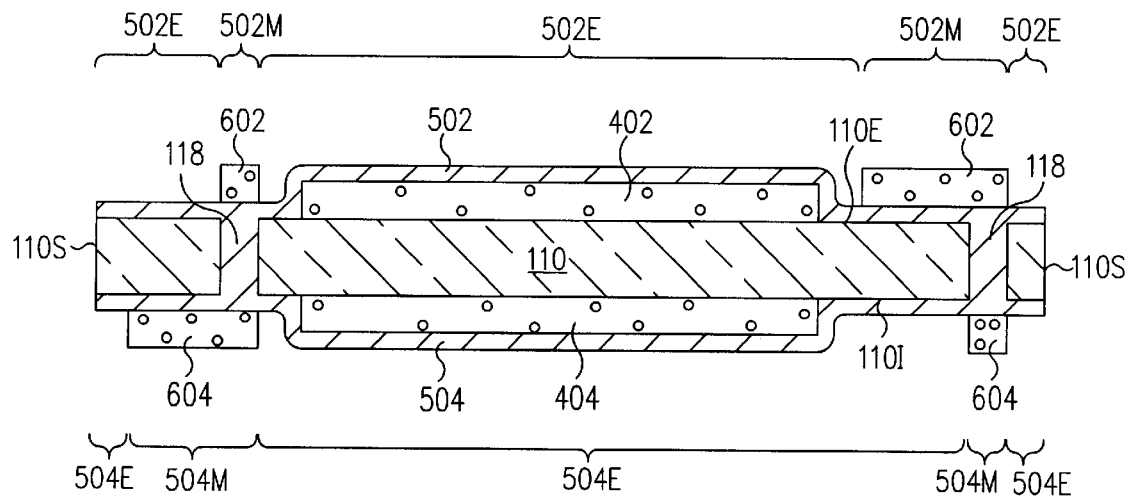

FIG. 6 is a cross-sectional view of window 110 of FIG. 5 at a later stage of fabrication. Referring now to FIG. 6, a mask 602, e.g., photoresist, is formed on metal layer 502. Mask 602 is formed to cover and protect a protected, e.g., first, region 502M of metal layer 502, which corresponds to exterior traces 116. Mask 602 also covers and protects vias 118 at the interface of exterior surface 110E, i.e., vias 118 terminate at exterior surface 110E within protected region 502M of metal layer 502. An unprotected, e.g., second, region 502E of metal layer 502 is not covered by mask 602, and is therefore exposed and unprotected.

Similarly, a mask 604, e.g., photoresist, is formed on metal layer 504. Mask 604 is formed to cover and protect a protected, e.g., first, region 504M of metal layer 504, which corresponds to interior traces 114. Mask 604 also covers and protects vias 118 at the interface of interior surface 110I, i.e., vias 118 terminate at interior surface 110I within protected region 504M of metal layer 504. An unprotected, e.g., second, region 504E of metal layer 504 is not covered by mask 604, and is therefore exposed and unprotected.

Figure 7:
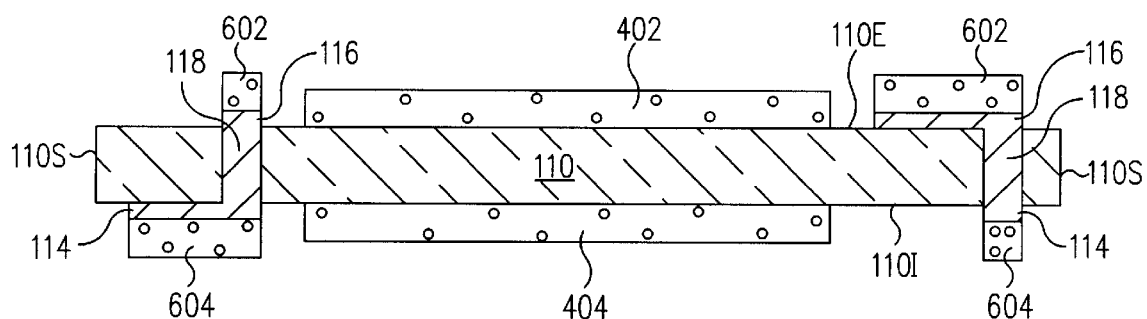

FIG. 7 is a cross-sectional view of window 110 of FIG. 6 at a later stage of fabrication. Referring now to FIGS. 6 and 7 together, unprotected regions 502E, 504E of metal layers 502, 504, respectively, are removed, e.g., by etching. The remaining protected regions 502M, 504M of metal layers 502, 504 form exterior traces 116 and interior traces 114 on exterior surface 110E and interior surface 110I of window 110, respectively. Of importance, central regions CR of exterior surface 110E and interior surface 110I of window 110 are protected by masks 402, 404 during etching of metal layers 502, 504, respectively. After etching of metal layers 502, 504, masks 402, 404, 602, 604, are removed.

Referring again to FIG. 2, in one embodiment, pads 120 are formed on exterior traces 116. Illustratively, to form pads 120, window 110 is masked to only expose the portions of exterior traces 116 upon which pads 120 are to be formed. An electrically conductive material is then formed, e.g., by plating or evaporation, on these exposed portions of exterior traces 116 to form pads 120.

Although fabrication of a single window 110 is illustrated in FIGS. 4, 5, 6, and 7 and discussed above, in an alternative embodiment, a plurality of windows 110 are formed from a single sheet, e.g., of borosilicate glass, in a manner similar to that described above and this single sheet is singulated to form windows 110.

Figure 8:
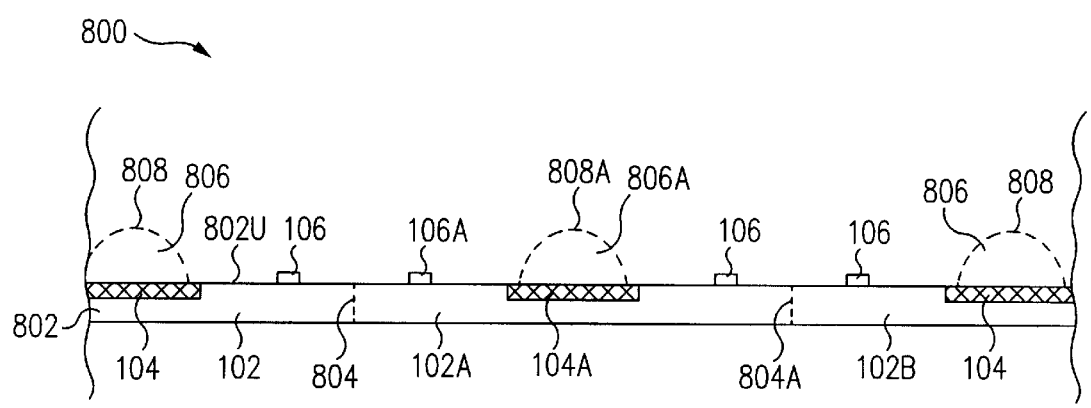
FIG. 8 is a cross-sectional view of a structure during the fabrication of a plurality of image sensor packages in accordance with one embodiment of the present invention.

FIG. 8 is a cross-sectional view of a structure 800 during the fabrication of a plurality of packages 100 in accordance with one embodiment of the present invention. Referring to FIG. 8, structure 800 includes an image sensor substrate 802 such as a silicon wafer. Image sensor substrate 802 includes a plurality of image sensors 102 integrally connected together. Image sensors 102 include active areas 104 formed on an upper, e.g., first, surface 802U of image sensor substrate 602. Image sensors 102 further include bond pads 106 on upper surface 802U of image sensor substrate 802.

To illustrate, a first image sensor 102A of the plurality of image sensors 102 includes a first active area 104A of the plurality of active areas 104. Image sensor 102A also includes a first bond pad 106A. The other image sensors 102 include active areas 104 and bond pads 106 in a similar manner.

Image sensors 102 are integrally connected together in an array, e.g., a 2=2, 3=3 . . . or nxm array. Each of image sensors 102 is delineated by a singulation street 804, which is located between adjacent image sensors 102. For example, a first singulation street 804A of the plurality of singulation streets 804 delineates first image sensor 102A from a second image sensor 102B of the plurality of image sensors 102. The other image sensors 102 are similarly delineated from adjacent image sensors 102 by corresponding singulation streets 804.

Figure 9:
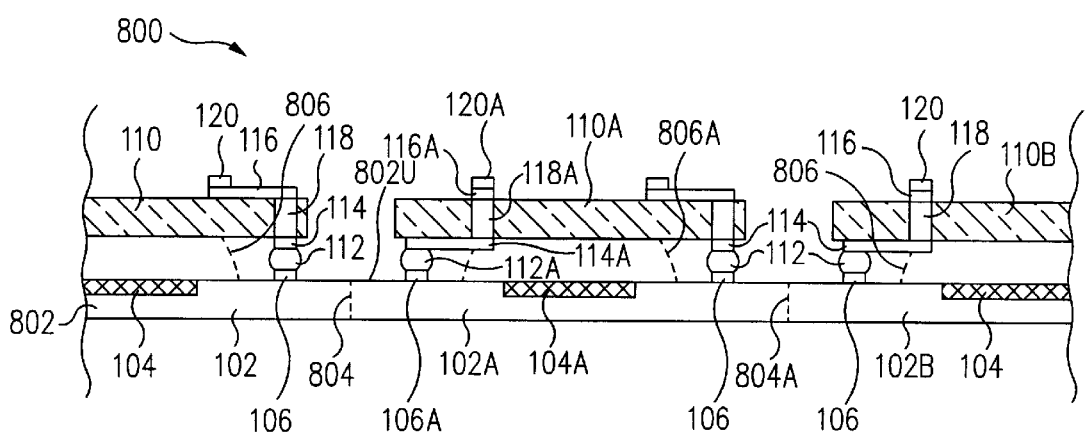
FIGS. 9, 10 and 11 are cross-sectional views of the structure of FIG. 8 at further stages of fabrication.

FIG. 9 is a cross-sectional view of structure 800 of FIG. 8 at a further stage of fabrication. Referring now to FIG. 9, windows 110 are mounted to image sensors 102 and above active areas 104 by bumps 112. Stated another way, windows 110 are flip chip mounted to image sensors 102.

To mount windows 110, each window 110 is aligned with image sensor substrate 802 using any one of a number of alignment techniques, e.g., windows 110 are optically or mechanically aligned, and attached to image sensor substrate 802. More particularly, interior traces 114 on interior surfaces 110I of windows 110 are aligned with corresponding bond pads 106. Bumps 112 are formed between interior traces 114 and bond pads 106 thus mounting windows 110 to corresponding image sensors 102.

To illustrate, a first interior trace 114A is formed on interior surface 110I of a first window 110A of the plurality of windows 110. Interior trace 114A is aligned with bond pad 106A. Bump 112A is formed between interior trace 114A and bond pad 106A. Bump 112A physically and electrically connects interior trace 114A to bond pad 106A thus mounting window 110A to image sensor 102A. The other windows 110 are mounted to the other image sensors 102 in a similar manner.

Windows 110 are attached to image sensors 102 by bumps 112 using any one of a number of techniques. For example, solder bumps are formed on bond pads 106 of image sensors 102 or interior traces 114, and these solder bumps are reflowed to form bumps 112 and to attach bond pads 106 to interior traces 114. Alternatively, bond pads 106 of image sensors 102 are attached to interior traces 114 by bumps 112 formed by applying an electrically conductive epoxy paste or film to bond pads 106 or interior traces 114 and thermally or optically curing this electrically conductive epoxy paste or film. As a further alternative, bond pads 106 of image sensors 102 are attached to interior traces 114 by bumps 112 formed by thermal or thermosonic bonding of gold bumps formed on bond pads 106 or interior traces 114. In light of this disclosure, those of skill in the art will understand that other methods of attaching windows 110 to image sensor substrate 802 can be used.

Figure 10:
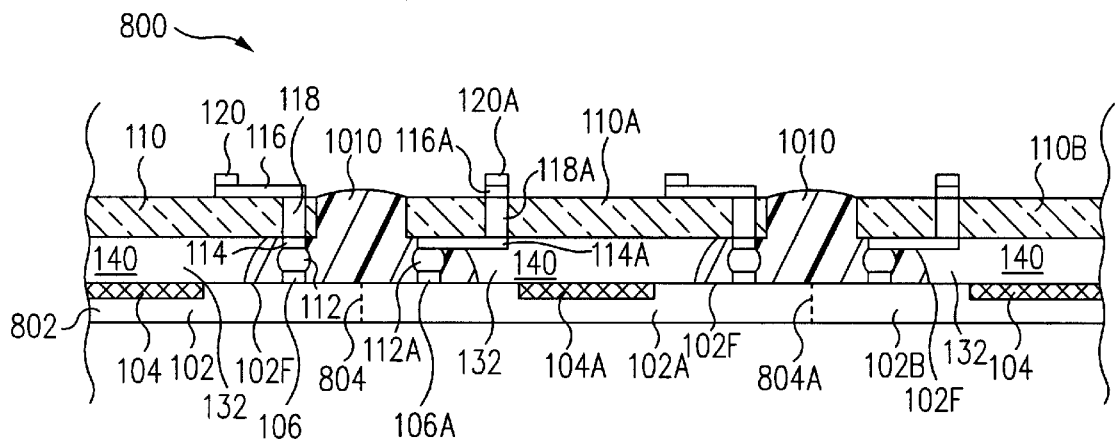

FIG. 10 is a cross-sectional view of structure 800 of FIG. 9 at a further stage of fabrication. Referring now to FIG. 10, a sealer 1010 is applied above singulation streets 804 and between windows 110. Illustratively, sealer 1010 is a limited flow encapsulant such as Hysol 4323, 4450, or 4451. Sealer 1010 forms a seal between windows 110 and front surfaces 102F of image sensors 102. In one embodiment, sealer 1010 is drawn between interior surfaces 110I of windows 110 and front surfaces 102F of image sensors 102 due to capillary action. However, sealer 1010 is only drawn slightly towards active areas 104 such that sealer 1010 does not contact active areas 104.

To illustrate, sealer 1010 is applied above singulation street 804A and between window 110A and a second window 110B of the plurality windows 110. Sealer 1010 forms a seal between image sensors 102A, 102B and windows 11A, 110B, respectively. Sealer 1010 is applied between the other windows 110 in a similar manner.

In one embodiment, after sealer 1010 is applied, and cured if necessary, image sensor substrate 802 is singulated along singulation streets 804. During this singulation of image sensor substrate 802, sealer 1010 is also singulated into beads 130 (FIG. 2). Alternatively, image sensor substrate 802 is singulated after interconnection balls 122 are formed on corresponding pads 120 as discussed in greater detail below with reference to FIG. 11.

Figure 11:
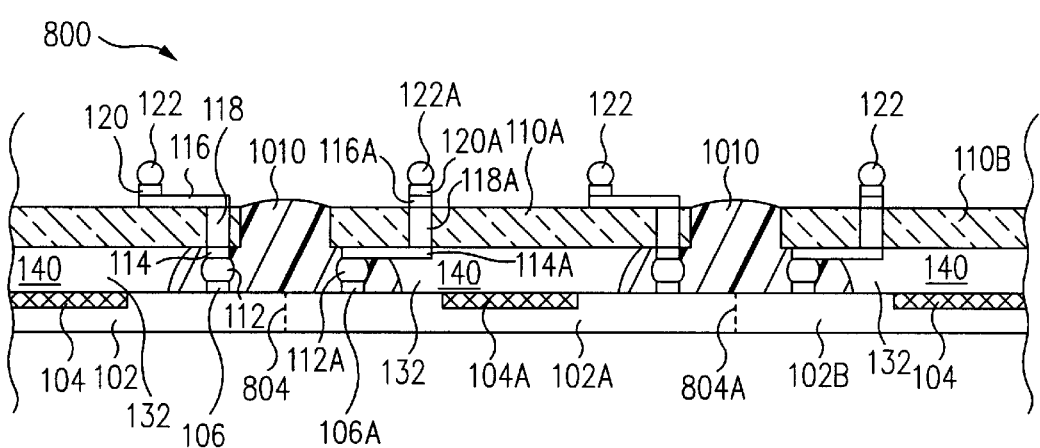

FIG. 11 is a cross-sectional view of structure 800 of FIG. 10 at a further stage of fabrication. Referring now to FIG. 11, interconnection balls 122 are formed on corresponding pads 120. To illustrate, interconnection ball 122A is formed on pad 120A. The other interconnection balls 122 are formed on the other pads 120 in a similar manner.

After formation of interconnection balls 122, image sensor substrate 802 and sealer 1010 are singulated along singulation streets 804 resulting in a plurality of packages 100 (FIGS. 1 and 2). Alternatively, interconnection balls 122 are formed after image sensor substrate 802 and sealer 1010 are singulated along singulation streets 804.

As described above in reference to FIGS. 8, 9, 10 and 11, a plurality of packages 100 are fabricated simultaneously. However, in light of this disclosure, those of skill in the art will recognize that packages 100 can also be manufactured on an individual basis, if desired.

In accordance with an alternative embodiment, a plurality of packages 300 (FIG. 3) are simultaneously fabricated. Packages 300 are fabricated in a manner similar to the fabrication of packages 100 described above and illustrated in FIGS. 8, 9, 10 and 11 and only the significant differences are discussed below.

Referring again to FIG. 8, in accordance with this embodiment, before windows 110 are mounted, drops 806, e.g., of a transparent liquid encapsulant, are applied to each active area 104 such that drops 806 are on active areas 104. To illustrate, a first drop 806A of the plurality of drops 806 is applied to, and is on, active area 104A. In one embodiment, drop 806A is applied by pin transfer of an appropriate bonding material, such as adhesive. More particularly, a pin is dipped in a bath of the bonding material, the pin is removed from the bath such that the tip of the pin is coated with the bonding material, and the tip of the pin is moved adjacent to active area 104A. The bonding material is transferred from the tip of the pin to active area 104A to form drop 806A. However, in light of this disclosure, those of skill in the art will recognize that other techniques can be used to apply drop 806A to active area 104A. For example, drop 806A is formed using a syringe and/or screen printing techniques. The other drops 806 are formed in a similar manner simultaneously or, alternatively, one at a time.

Of importance, drop 806A has an apex 808A near, or at, the horizontal center of drop 806A. The other drops 806 have corresponding apexes 808 near the corresponding horizontal centers in a similar manner.

Referring now to FIGS. 8 and 9 together, windows 110 are pressed into corresponding drops 806 (drops 806 are illustrated in dashed lines in FIG. 9) during flip chip mounted of windows 110 to image sensors 102.

To illustrate, first window 110A is pressed into drop 806A during flip chip mounted of window 110A to image sensor 102A. Of importance, since drop 806A is formed to have an apex 808A, window 110A initially contact apex 808A. As window 110A is pressed into drop 806A, drop 806A is squeezed by window 110A downwards, e.g., in a first direction, towards active area 104A and outwards from apex 808A. Squeezing drop 806A in this manner avoids bubble formation, i.e., avoids entrapment of air under window 110A. These bubbles would otherwise distort radiation striking active area 104.

Further, drop 806A has a volume sufficient to entirely cover active area 104A of image sensor 102A after window 110A is pressed into place. In one embodiment, drop 806A is formed within active area 104A and is squeezed to entirely covers active area 104A after window 110A is pressed into place. If necessary, drop 806A is cured. Drop 806A forms medium 140A (FIG. 3). Fabrication then proceeds in a manner similar to that illustrate in FIGS. 10 and 11 and described above resulting in the fabrication of a plurality of packages 300 (FIG. 3).

This application is related to Glenn et al., co-filed and commonly assigned U.S. patent application Ser. No. 09/713, 848 entitled "FLIP CHIP ON GLASS IMAGE SENSOR PACKAGE," which is herein incorporated by reference in its entirety.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

We claim:

1. A method comprising:

forming an electrically conductive exterior trace on an exterior surface of a window;

forming an electrically conductive interior trace on an interior surface of said window, said interior trace being electrically connected to said exterior trace;

aligning said interior trace with a bond pad on a first surface of an image sensor; and forming an electrically conductive bump between said interior trace and said bond pad.

2. The method of claim 1 wherein said window has an area less than an area of said first surface of said image sensor.

3. The method of claim 1 wherein said forming an electrically conductive bump comprises:

forming a solder bump on said bond pad or interior trace; and reflowing said solder bump.

4. The method of claim 1 wherein said forming an electrically conductive bump comprises:

applying an electrically conductive epoxy paste or film to said bond pad or interior trace; and curing said epoxy paste or film.

5. The method of claim 1 wherein said forming an electrically conductive bump comprises:

forming a gold bump on said bond pad or interior trace; and thermal or thermosonic bonding said gold bump.

6. The method of claim 1 further comprising applying a sealer to form a bead between said window and said first surface of said image sensor.

7. The method of claim 6 wherein said image sensor comprises an active area on said first surface, said active area being located within a sealed cavity defined by said window, said bead and said image sensor.

8. The method of claim 7 wherein said sealed cavity comprises a medium.

9. The method of claim 8 wherein said medium is air.

10. The method of claim 8 wherein said medium is an encapsulant.

11. The method of claim 10 further comprising applying a drop to said active area, said drop forming said medium.

12. The method of claim 1 wherein an image sensor substrate comprises a plurality of image sensors including said image sensor, said method further comprising singulating said image sensor substrate.

13. A method comprising:

forming a first mask on a central region of an interior surface of a window;

forming an electrically conductive layer on a peripheral region of said interior surface of said window surrounding said central region and on said first mask;

forming a second mask on said electrically conductive layer to protect a first region of said electrically conductive layer and to expose a second region of said electrically conductive layer;

removing said second region of said electrically conductive layer, wherein said first region of said electrically conductive layer comprises an interior trace;

removing said first and second masks;

aligning said interior trace with a bond pad on a first surface of an image sensor; and forming an electrically conductive bump between said bond pad and said interior trace to mount said window to said image sensor, said central region of said interior surface of said window being aligned with an active area of said image sensor.

14. The method of claim 13 wherein said window has an area less than an area of said first surface of said image sensor.

15. The method of claim 13 further comprising forming an electrically conductive exterior trace on an exterior surface of said window, said exterior trace being electrically connected to said interior trace.

16. The method of claim 15 further comprising forming an electrically conductive via through said window, said via electrically connecting said exterior trace to said interior trace.

17. The method of claim 13 wherein an image sensor substrate comprises a plurality of image sensors including said image sensor, said method further comprising singulating said image sensor substrate.

18. A method comprising:

forming an electrically conductive interior trace on an interior surface of a window;

aligning said interior trace with a bond pad on a first surface of an image sensor, said window having an area less than an area of said first surface of said image sensor; and forming an electrically conductive bump between said interior trace and said bond pad to mount said window to said image sensor.

* * * * *